United States Patent [19]
Thompson, Sr.

[11] Patent Number: 5,876,498
[45] Date of Patent: Mar. 2, 1999

[54] APPARATUS FOR PRESERVING SOLDER PASTE IN THE MANUFACTURING OF PRINTED CIRCUIT BOARD ASSEMBLIES

[75] Inventor: Curtis C. Thompson, Sr., Meridian, Id.

[73] Assignee: MOMS, Inc., Nampa, Id.

[21] Appl. No.: 772,155

[22] Filed: Dec. 20, 1996

[51] Int. Cl.$^6$ .................................................. B05C 21/00
[52] U.S. Cl. ............................ 118/64; 118/213; 118/406; 118/504; 118/505; 427/96; 427/272; 427/282; 101/127.1
[58] Field of Search ............................ 118/64, 213, 301, 118/406, 504, 505; 427/96, 272, 282; 101/127.1; 434/87; 220/345, 346, 350, 351, 252; 206/706, 724

[56] References Cited

U.S. PATENT DOCUMENTS 4,784,310  11/1988  Metzger et al. ........................ 427/282
5,400,914  3/1995  Lin ........................................ 220/345
5,622,108  4/1997  Benedetto et al. ................... 101/127.1

Primary Examiner—Laura Edwards
Attorney, Agent, or Firm—Seed and Berry LLP

[57] ABSTRACT

A device for preserving solder paste in the manufacturing of printed circuit board assemblies. In one embodiment, the preserving device has a frame adapted to be positioned on a stencil plate of a solder paste stenciling machine and a cover coupled to the frame. The frame has a wall that is configured to substantially surround at least a portion of the solder paste on the stencil plate between printing cycles. In a preferred embodiment, the wall is configured to surround a working region on the stencil plate defined by the area on the stencil plate that the solder paste contacts during a printing cycle. The cover is coupled to the frame to form a protective compartment that substantially houses the solder paste between printing cycles. As a result, the preserving device restricts the airflow across the solder paste to protect the solder paste from environmental elements within the stenciling machine.

31 Claims, 3 Drawing Sheets

APPARATUS FOR PRESERVING SOLDER PASTE IN THE MANUFACTURING OF PRINTED CIRCUIT BOARD ASSEMBLIES

TECHNICAL FIELD

The present invention relates to surface mounting electrical components onto printed circuit boards, and more particularly to stencil printing solder pastes onto the printed circuit boards.

BACKGROUND OF THE INVENTION

Printed circuit board assemblies with electrical components are used in computers, communications equipment, televisions, and many other products. A printed circuit board ("PCB") is generally a laminated board with circuit traces on one or both external surfaces and sometimes at an interlayer level within the board. A wide variety of electrical components are mounted on one or both external surfaces of the circuit board, such as processors, memory devices, clocks, resistors, capacitors and virtually any other type of electrical component. The electrical components are attached to selected locations on the external surfaces of the PCB with a solder paste so that the electrical components are coupled together by the inlaid circuitry of the PCB. The electrical components are typically attached to the PCB with surface mounting or throughhole mounting processes.

To surface mount components to a PCB, a solder paste is deposited onto the surfaces of the PCB, and then the components are pressed against the solder paste. The solder paste is generally deposited onto the PCB with a highly accurate stenciling machine that has a stencil plate and a wiper mechanism. The stencil plate has a plurality of holes configured in a pattern corresponding to a desired pattern of solder pads on the PCB, and the wiper mechanism has a wiper blade attached to a movable wiper head that moves the wiper blade across the top surface of the stencil plate. In operation, a large volume of solder paste sufficient to pattern a large number of PCBs is placed on top of the stencil plate along one side of the pattern of holes. A first PCB is then pressed against the bottom of the stencil plate and the wiper blade is moved across the stencil plate to drive the solder paste through the holes onto the first PCB. The first PCB is removed from the bottom of the stencil plate, and the process is repeated for the rest of the PCBs that have the same pattern of solder pads.

One problem with conventional solder printing equipment and processes is that the solder paste deteriorates after it is removed from its container and eventually becomes unusable. In low humidity environments, for example, the flux material may dry-out until the solder paste does not adequately flow through the holes in the stencil plates. Conversely, in high humidity environments, the flux may absorb too much moisture until the viscosity of the solder paste is too low to maintain the pattern of discrete solder pads on a PCB after the PCB is removed from the stencil plate. Depending upon the particular climate and environment of the PCB manufacturing facility, the expected life of solder paste on a stencil plate is approximately 6–8 hours. Accordingly, solder paste that remains on the stencil plate for over 6–8 hours is often unusable.

The problem of wasting solder paste is particularly acute in the assembly of large and very large PCB assemblies because the stencil printing machines process the PCBs much faster than the other stations of a typical PCB assembly line. For example, the waiting period between prints may be 5–10 minutes for large PCB assemblies and over 15 minutes for very large PCB assemblies. Since the solder paste may sit idle on the stencil plate between printing cycles for several minutes, a significant volume of solder paste may remain unused on the stencil plate after 6–8 hours. Thus, a significant portion of the solder paste may be wasted in the manufacturing of large and very large PCB assemblies.

In light of the problems with conventional solder printing devices, it would be desirable to develop a device and process that reduces the waste of solder paste in manufacturing of PCB assemblies.

SUMMARY OF THE INVENTION

The present invention is a device for preserving solder paste in the manufacturing of printed circuit board assemblies. In one embodiment, the preserving device has a frame adapted to be positioned on a stencil plate of a solder paste stenciling machine, and a moveable cover coupled to the frame. The frame has a wall that is configured to surround at least a portion of the solder paste on the stencil plate between printing cycles. The wall is preferably configured to surround a working region on the stencil plate that is defined by the area on the stencil plate over which a wiper assembly moves the solder paste during a printing cycle. The cover is coupled to the frame to form a protective compartment that protects the solder paste from environmental elements within the stenciling machine between printing cycles.

In another embodiment, the wall of the frame has a first section parallel to a first axis of the preserving device, a second section substantially parallel to the first axis and spaced apart from the first section, a third section transverse to the first axis and positioned between the first and second sections, and a fourth section spaced apart from the third section and transverse to the first axis between the first and second sections. The sections of the wall are configured to surround at least a portion of the solder paste, and they are preferably configured to surround the working region on the stencil plate. The solder paste preserver also has a canopy configured to substantially cover an opening defined by the four sections of the wall. The canopy and the wall, therefore, also define a compartment that houses the solder paste on the stencil plate to restrict the airflow across the solder paste between printing cycles.

In a preferred embodiment, the cover is a retractable cover or a removable cover that may be selectively positioned over at least a portion of the opening defined by the frame to substantially enclose the solder paste between printing cycles. The retractable cover is preferably in a retracted position towards a first end of the frame to allow a wiper of the solder paste stenciling machine to sweep the mass of solder paste from one side of the stencil plate to the other side of stencil plate. The retractable cover is then moved into an extended position in which it extends from the first end of the frame to a second end of the frame to form a protective compartment around the remaining mass of solder paste on the stencil plate.

DETAILED DESCRIPTION OF THE INVENTION

The present invention is a method and apparatus for preserving a mass of solder paste on a stencil plate between printing cycles in the manufacturing of printed circuit board assemblies. An important aspect of one embodiment of the invention is to provide a temporary compartment that encloses the solder paste on a stencil plate between printing cycles to restrict airflow over the surface of the solder paste. As a result, the preferred embodiment of the preserving device reduces the effects of environmental conditions within the stenciling machine to prolong the useful life of the solder paste. FIGS. 1–5, in which like reference numbers refer to like parts, illustrate several embodiments of solder paste preserving devices and methods in accordance with the invention.

Figure 1:
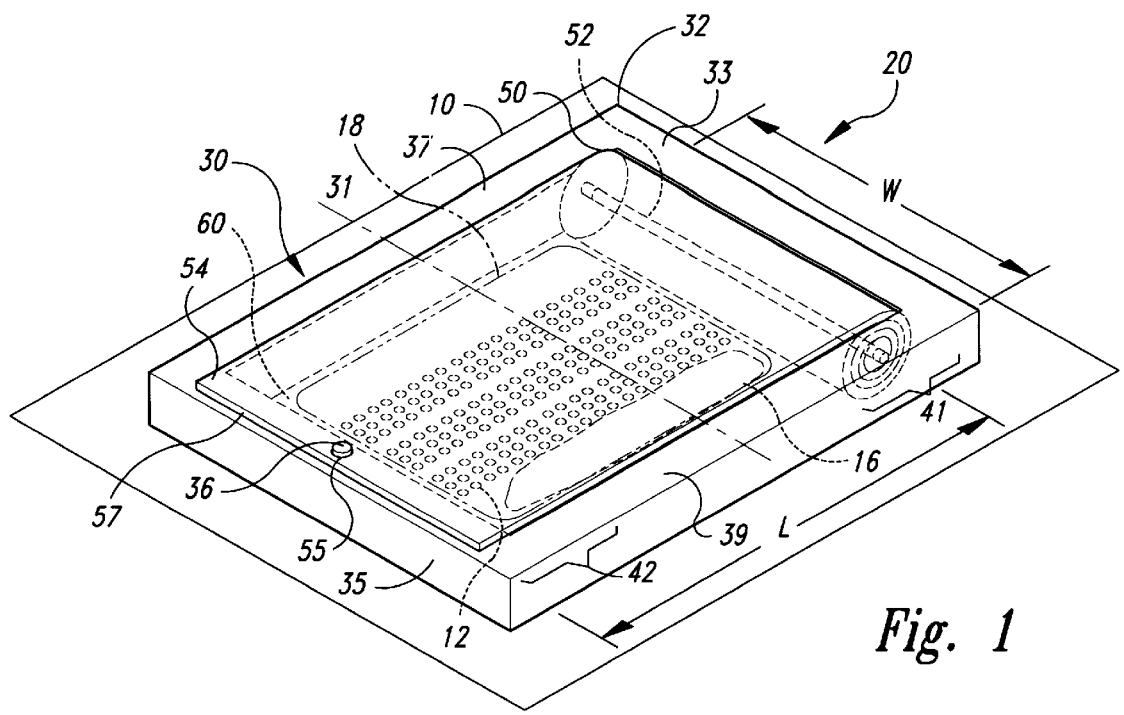
FIG. 1 is an isometric view of an embodiment of a device for preserving solder paste on a stencil plate in accordance with the invention.
Figure 2:
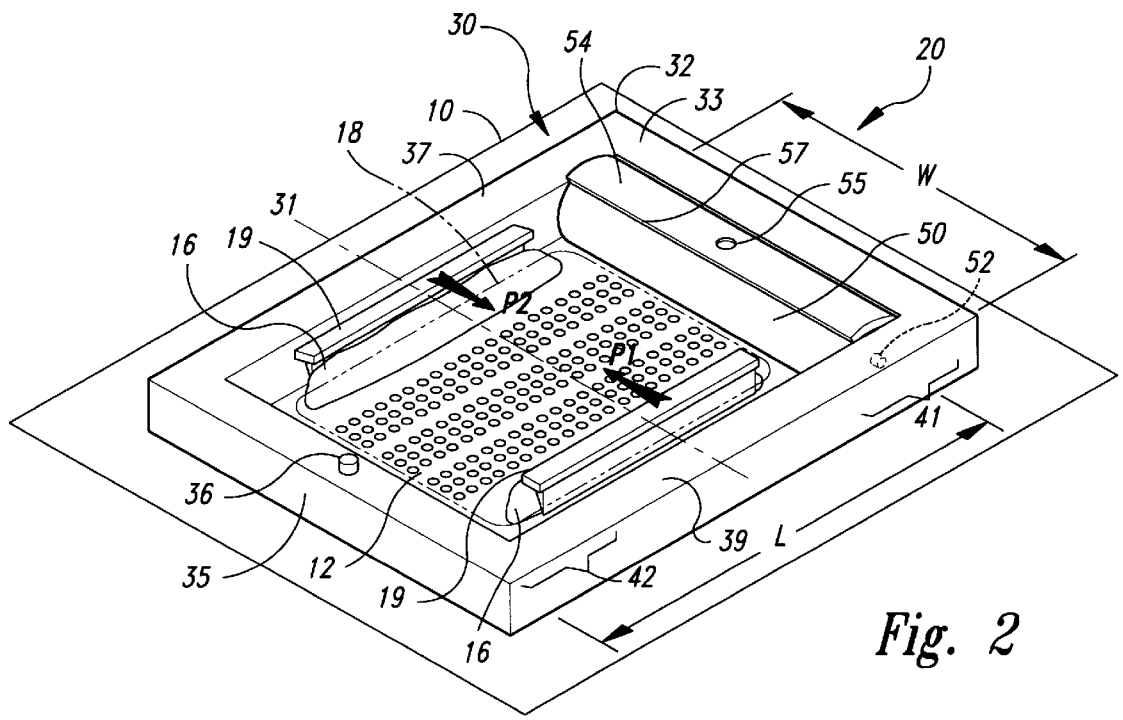
FIG. 2 is an isometric view of the device for preserving solder paste shown in FIG. 1 in a different operating configuration.

FIGS. 1 and 2 are isometric views of an embodiment of a solder paste preserving device 20 in accordance with the invention that provides a temporary compartment enclosing a mass of solder paste 16 on a stencil plate 10. The preserving device 20 has a frame 30 positioned on the stencil plate 10 and a cover 50 coupled to the frame 30. As described in detail below, the frame 30 and the cover 50 operate to selectively form a protective compartment 60 (shown in FIG. 1) housing the solder paste 16 between printing cycles. The frame 30 and the cover 50 also operate to allow a wiper assembly 19 (shown in FIG. 2) to access the solder paste 16 during a printing cycle.

The frame 30 is preferably a wall 32 that surrounds a working region 18 on the stencil plate 10. The working region 18 is defined by the area on the stencil plate 10 over which the wiper 19 moves the solder paste 16 during a printing cycle. The frame 30 preferably completely surrounds the working region 18, but the frame 30 may also be configured to surround only a portion of the working region 18 or just the elongated mass of solder paste 16 at one side of the stencil plate 10. In another embodiment (not shown), the frame 30 may not be a contiguous member so that the working area 18 or solder paste 16 is not completely surrounded by the frame 30.

In a preferred embodiment, the frame 30 is a contiguous wall 32 with a first section 33, a second section 35, a third section 37, and a fourth section 39. The first section 33 of the wall 32 is preferably substantially parallel to a first axis 31 of the wall 32, and the second section 35 of the wall 32 is spaced apart from the first section 33 and positioned substantially parallel to the first axis 31. The third section 37 of the wall 32 is preferably transverse to the first axis 31 in a position extending between the first and second sections 33 and 35 of the wall 32. Similarly, the fourth section 39 of the wall 32 is spaced apart from the third section 37 and transverse to the first axis 31 in a position extending between the first and second sections 33 and 35 of the wall 32. In a preferred embodiment, a catch 36 is attached to one of the sections of the wall 32 to hold the retractable cover 50 in an extended position over the stencil plate 10.

The wall 32 of the frame 30 is preferably rectilinear to completely surround the working region 18 of a typical stencil plate 10 that has a rectilinear pattern of holes 12. It will be appreciated, however, that the wall 32 of the frame 30 may be configured into any shape that provides a barrier proximate to the solder paste 16 to restrict or otherwise control airflow over the solder paste 16. For example, the wall 32 of the frame 30 may have an oval shape that surrounds only the elongated mass of solder paste 16 on the stencil 10.

The cover 50 is preferably retractable using a rod 52 attached to the frame 30 and a flexible sheet 54 attached to the rod 52. The rod 52 is preferably rotatably attached to a first end 41 of the frame 30 to extend across a widthwise dimension W of the frame 30. More preferably, the rod 52 is rotatably attached to the third and fourth sections 37 and 39 of the frame 30. The flexible sheet 54 is wrapped around the rod 52 so that the a leading edge 57 of the flexible sheet 54 may be pulled across a lengthwise dimension L to a second end 42 of the frame 30. The flexible sheet 54 preferably has a hole 55 or a hook (not shown) to engage the catch 36 and hold the leading edge 57 of the flexible sheet 54 in an extended position at the second end 42 of the frame 30. The frame 30 and the cover 50 accordingly form the compartment 60 to house the solder paste 16 in a manner that protects the solder paste 16 from environmental elements within the stenciling machine between printing cycles. The rod 52 preferably has a roll-up mechanism to wrap the flexible sheet 54 around the rod 52 and draw the leading edge 57 of the flexible sheet 54 to the first section 41 of the frame 30. Suitable rods 52 with roll-up mechanisms are well known in the art of window coverings, and more specifically in the art of roller-blinds for window.

The flexible sheet 54 is preferably made from a material that controls the humidity of the environment within the compartment 60. In one embodiment, either the entire flexible sheet 54 or its inner surface is made from an absorbent material to remove moisture from the air and thus reduce the humidity within the compartment 60. A suitable absorbent material for the flexible sheet 54 is a cloth carrying a desiccant. In another embodiment, the flexible sheet 54 or its inner surface is made from a material that may be hydrated to impart moisture into the air and thus increase the humidity within the compartment 60. One suitable hydrated material is a cloth wetted or saturated with water.

FIGS. 1 and 2 also illustrate the operation of the embodiment of the preserving device 20 in association with a typical process for printing solder paste onto a printed circuit board. To print a portion of the solder paste 16 onto a printed circuit board (not shown), the retractable cover 50 is moved into a retracted position in which the flexible sheet 54 is wrapped around the rod 52 so that the leading edge 57 of the flexible sheet 54 is positioned towards the first section 41 of the frame 30. The wiper blade 19 (FIG. 2) of the stenciling machine is then pressed against the stencil plate 10 within the interior of the frame 30 and moved in a direction $P_1$. As the wiper blade 19 moves across the stencil plate 10, the wiper blade 19 wipes the solder paste 16 across the stencil plate 10 and presses a portion of the solder paste 16 through the holes 12 onto the printed circuit board. The wiper blade 19 is then lifted from the stencil plate 10 and removed from the interior space within the frame 30.

To protect the solder paste 16 between printing cycles, the retractable cover 50 is moved into an extended position in which the flexible sheet 54 is unwrapped from the rod 52 until the leading edge 57 of the flexible sheet 54 is pulled from the first end 41 of the frame 30 to the second end 42. The hole 55 through the flexible sheet 54 is then passed over the pin 36 on the second section 35 of the frame 30 to hold the flexible sheet 54 in the extended position until the next printed circuit board (not shown) is ready for printing.

To print another portion of the solder paste 16 on the next printed circuit board, the hole 55 of the flexible sheet 54 is released from the catch 36 and the flexible sheet 54 is wrapped around the rod 52 until the leading edge 57 of the flexible sheet 54 is in the retracted position. The wiper assembly 19 then re-engages the stencil plate 10 and moves the remaining solder paste 16 across the stencil plate 10 in the opposite direction $P_2$. The preserving device 20 is accordingly opened and closed corresponding to the printing cycles of the printed circuit boards to protect the solder paste 16 on top of the stencil plate 10 between printing cycles.

One advantage of the embodiment of the preserving device 20 is that it restricts the airflow across the solder paste 16 on the stencil plate 10 between printing cycles. As discussed above in the background of the invention section, the solder paste 16 may sit on the stencil plate 10 between printing cycles for periods of five to more than fifteen minutes. Moreover, cooling fans that circulate air within the stenciling machines exacerbate the drying or hydrating of the solder paste 16 on the stencil plate 10. Thus, by forming a temporary compartment 60 on the stencil plate 10 that restricts the airflow across the solder paste 16, the preferred embodiment of the preserving device 20 substantially protects the solder paste 16 from the environment within the stenciling machine. The preferred embodiment of the preserving device 20 is accordingly expected to increase the useful life of solder paste on a stencil plate of a stenciling machine.

Another advantage of an embodiment of the preserving device 20 is that it provides control of the environment around the solder paste 16 between printing cycles. In the embodiments of the invention in which the cover 50 is made from an absorbent or hydrated material, the cover 50 provides additional control to add or remove moisture from the air within the compartment 60. For example, in low humidity climates and environments, a hydrated cover may reduce the drying of the solder paste 16. Similarly, in high humidity environments and climates, an absorbent cover 50 may inhibit over hydration of the mass of solder paste 16. As a result, the preferred environment of the preserving device 20 further controls the environment within the compartment 60 enclosing the solder paste 16 to increase the useful life of the solder paste 16. Additionally, air that has been conditioned to have a low or high humidity may be directed into the compartment 60 beneath the cover 50.

Figure 3:
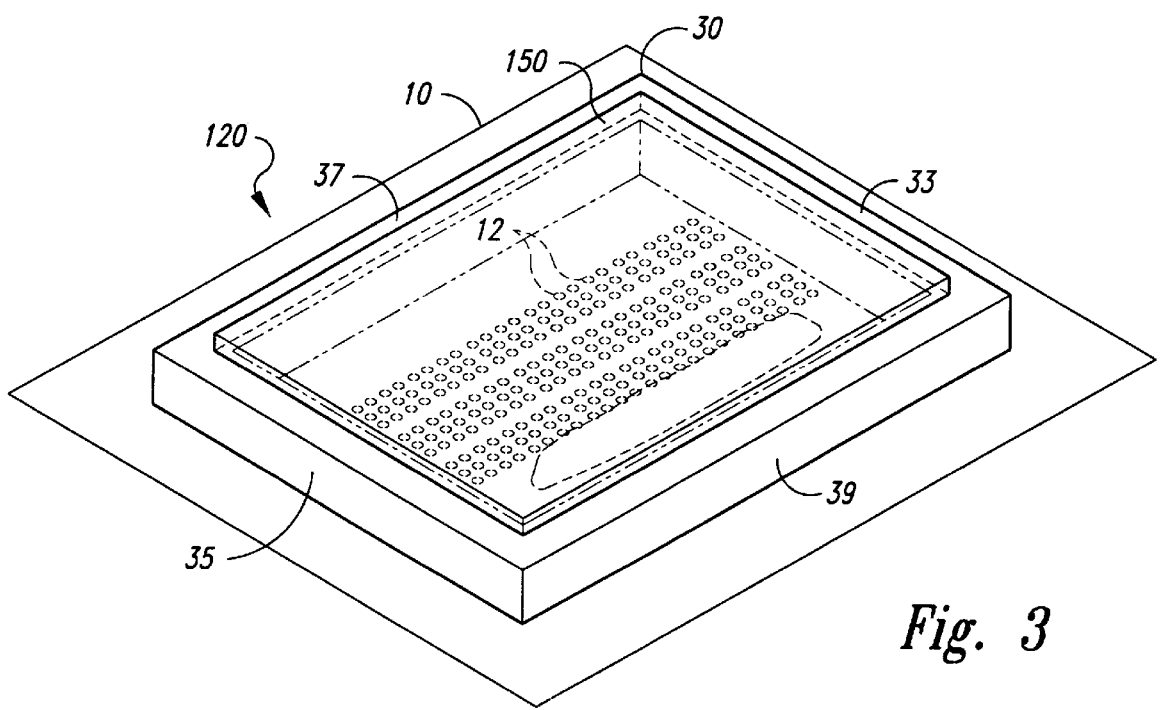
FIG. 3 is an isometric view of another embodiment of a device for preserving solder paste on a stencil plate in accordance with the invention.

FIG. 3 is an isometric view of another embodiment of a preserving device 120 in accordance with the invention that may also be positioned on the stencil plate 10. The preserving device 120 has a frame 30 and a removable cover 150 that may be removeably attached to the frame 30. As discussed above in FIGS. 1 and 2, the frame 30 is preferably a wall 32 with first-fourth sections 33, 35, 37 and 39, respectively. The removable cover 150 is preferably a rigid lid that is configured to rest on top of the wall sections 33, 35, 37 and 39. The removable cover 150 may alternatively be a flexible lid (not shown) that is adhered to the top surface of the frame 30 by an adhesive or fasteners. For example, a releasable adhesive such as that on Highland ® Brand Notes manufactured by 3M Corporation of St. Paul, Minn. may be used to releasably attach the flexible lid to the wall sections 33, 35, 37 and 39. Additionally, the fasteners may be a hook and eye system, snaps or velcro strips that releasably attached the flexible lid to the frame 30. In operation, the removable cover 150 is removed from the frame 30 during a printing cycle, and then the removable cover 150 is placed back on the frame 30 between printing cycles. Accordingly, the preferred embodiment of the preserving device 120 operates in a similar manner as the preferred embodiment of the preserving device 20 shown in FIGS. 1 and 2.

Figure 4:
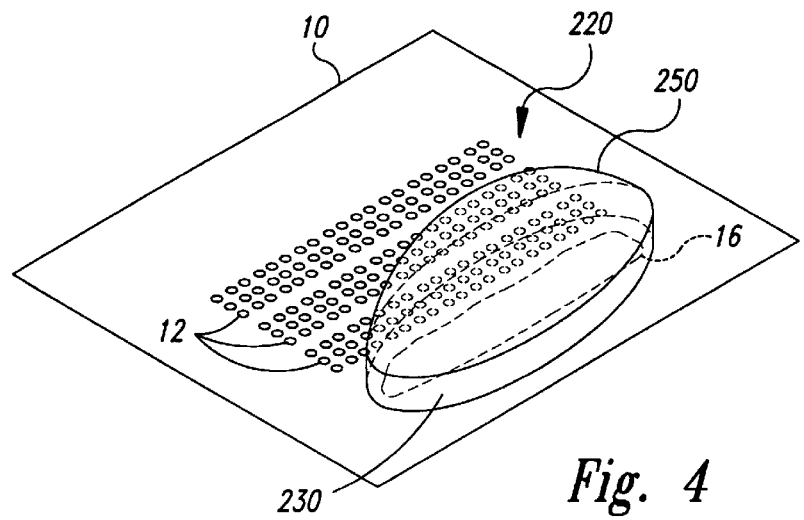
FIG. 4 is an isometric view of another embodiment of a device for preserving solder paste on a stencil plate in accordance with the invention.

FIG. 4 is an isometric view of another preserving device 220 in accordance with the invention. The preserving device 220 is a shell having a lower portion or frame 230 and an upper portion or ceiling 250 attached to the lower portion 230 of the shell. The lower portion 230 of the shell is preferably configured to surround the solder paste 16 between printing cycles. In another embodiment (not shown), the lower portion 230 of the shell is configured to surround the working region 18, as discussed above with respect to the preserving device 20 in FIGS. 1 and 2. In operation, the preserving device 220 is preferably removed from the stencil plate 10 during a printing cycle when the wiper (not shown) engages the stencil plate 10 and sweeps the solder paste 16 across the stencil plate 10. After the wiper is removed from the stencil plate 10, the preserving device 220 is then placed back on the opposite side of the stencil plate 10 over the remaining solder paste 16 on the stencil plate 10.

Figure 5:
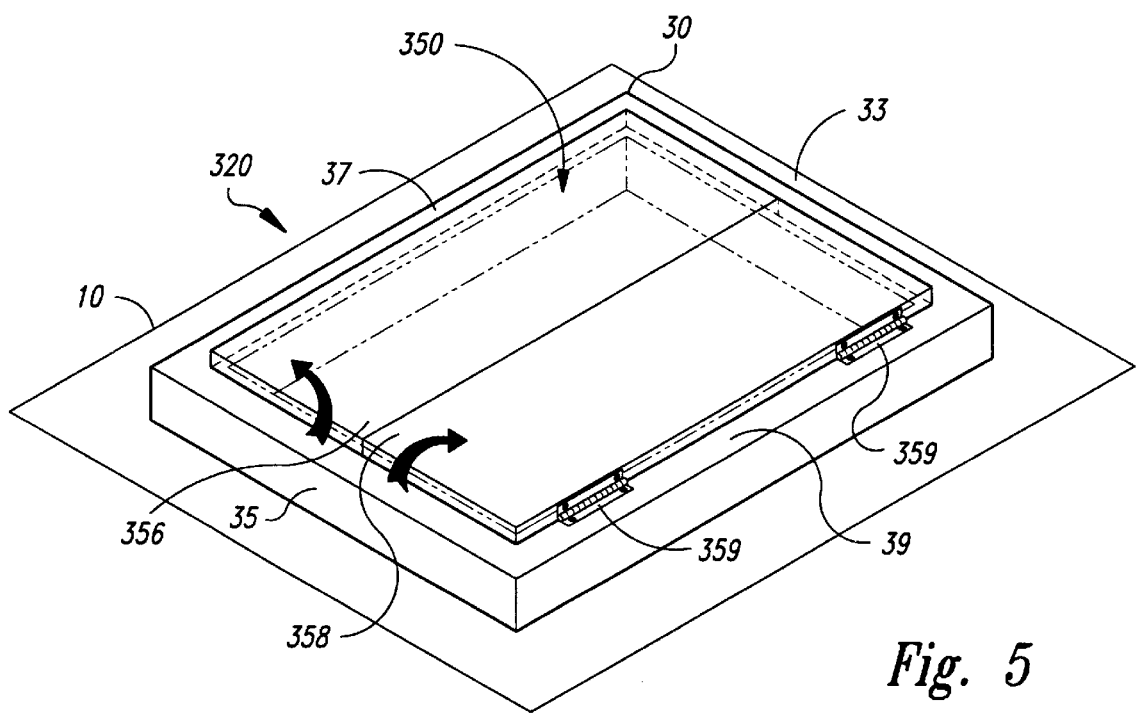
FIG. 5 is an isometric view of still another embodiment of a device for preserving solder paste on a stencil plate in accordance with the invention.

FIG. 5 is an isometric view of another embodiment of a preserving device 320 in accordance with the invention. The preserving device 320 has a frame 30, a first lid 356 pivotally attached to one side of the frame 30, and a second lid 358 pivotally attached to another side of the frame 30. The lids 356 and 358 are preferably attached to frame 30 with a plurality of hinges 359, and the lids 356 and 358 are preferably rigid to easily pivot about the hinges 359. The first and second lids 356 and 358 are opened to print solder paste on a printed circuit board (not shown), and then the first and second lids 356 and 358 are closed to enclose the solder paste 16 between printing cycles. The lids 356 and 358 are accordingly small doors that may be selectively opened and closed to protect the solder paste 16 between printing cycles.

From the foregoing it will be appreciated that, although specific embodiments of the invention have been described herein for purposes of illustration, various modifications may be made without deviating from the spirit and scope of the invention. For example, the retractable cover may have an accordian-like flexible sheet with a fixed edge attached to the first end of the frame and a leading edge that may be moved to the second end of the frame. Also, even though the frame of the preserving device is generally shown as being smaller than the stencil plate, the frame may be at least the same size as the stencil plate on one or both planar dimensions. Accordingly, the invention is not limited except as by the appended claims.

What is claimed is:

1. A device for preserving a mass of solder paste on a stencil plate of a solder paste stenciling machine, comprising:

a frame to be positioned on the stencil plate, the frame having a wall configured to surround at least a portion of the solder paste on the stencil plate; and a rod attached to the frame at a first end of the frame; and a flexible sheet attached to the rod defining a retractable cover, the flexible sheet being retractable to the rod in a retracted position at the first end of the frame to allow a wiper to move the solder paste across the stencil plate and deposit a portion of the solder paste onto a printed circuit board, and the flexible sheet being extensible from the rod to a second end in an extended position to form a protective compartment enclosing the solder paste on the stencil plate between printing cycles.

2. The device of claim 1 wherein the rod is a roller rotatably attached to the frame, and wherein the flexible sheet is wrapped around the roller in the retracted position and at least a portion of the flexible sheet is unwrapped from the roller in the extended position.

3. The device of claim 1 wherein:

the wall comprises a first section parallel to a first axis of the frame, a second section at least substantially parallel to the first axis and spaced apart from the first section, a third section transverse to the first axis and positioned between the first and second sections, and a fourth section transverse to the first axis and positioned between the first and second sections, the fourth section being spaced apart from the third section; and the rod extends across the frame from the third section to the fourth section at a location near the first section, the rod being rotatably attached to the third and fourth sections.

4. The device of claim 1 wherein the flexible sheet comprises an absorbent material to reduce moisture within the compartment when the retractable cover is in the extended position.

5. The device of claim 1 wherein the flexible sheet comprises a hydrated material to increase moisture within the compartment when the retractable cover is in the extended position.

6. A solder paste preserver for protecting a mass of solder paste on a stencil plate of a solder paste stenciling machine used in the manufacturing of printed circuit board assemblies, comprising:

a wall to be positioned on the stencil plate, the wall having a first section parallel to a first axis of the preserver, a second section at least substantially parallel to the first axis and spaced apart from the first section, a third section transverse to the first axis between the first and second sections, and a fourth section spaced apart from the third section and transverse to the first axis between the first and second sections, the first, second, third and fourth sections being configured to surround at least a portion of the solder paste on the stencil plate between printing cycles; and a moveable canopy configured to substantially cover an opening defined by the first, second, third and fourth sections of the wall, the canopy and wall defining a compartment to contain the solder paste between printing cycles.

7. The device of claim 6 wherein the canopy comprises a retractable cover attached to the wall, the retractable cover being in a retracted position at a location near the first section to allow a wiper to move the solder paste across the stencil plate and deposit a portion of the solder paste onto a printed circuit board, and the retractable cover being positionable in an extended position from the first section to the second section to enclose the solder paste between printing cycles.

8. The device of claim 7 wherein the retractable cover comprises:

a rod extending from the third section to the fourth section at a location near the first section, the rod being rotatably attached to the third and fourth sections; and a flexible sheet attached to the rod, the flexible sheet being wrapped around the rod in the retracted position, and at least a portion of the flexible sheet being unwrapped from the rod in the extended position.

9. The device of claim 8 wherein the flexible sheet comprises an absorbent material to reduce moisture within the compartment when the retractable cover is in the extended position.

10. The device of claim 8 wherein the flexible sheet comprises a hydrated material to increase moisture within the compartment when the retractable cover is in the extended position.

11. The device of claim 6 wherein the canopy comprises a removable cover configured to engage an upper surface of at least one of the first, second, third and fourth sections of the wall.

12. The device of claim 6 wherein the canopy comprises a lid pivotally attached to the frame.

13. The device of claim 6 wherein the canopy comprises a ceiling formed integrally with the wall, the device being removable from the stencil plate to allow a wiper to move the solder paste across the stencil plate.

14. The solder paste preserver of claim 13 wherein the solder paste is an elongated strip of solder paste extending along a side of the stencil plate, and wherein the lower section of the shell is a frame configured to encompass the elongated strip of solder paste without encompassing a working region on the stencil plate over which the elongated strip of solder paste is moved to print a portion of the solder paste onto a printed circuit board.

15. The solder paste preserver of claim 13 wherein the upper section of the shell is a cover formed integrally with the lower section.

16. A solder paste preserver, comprising a shell to be positioned on a stencil plate of a solder paste stenciling machine, the shell having a lower section configured to substantially encompass a mass of solder paste on the stencil plate and an upper section extending over a portion of the stencil plate to substantially enclose the mass of solder paste in a chamber defined by the shell and the stencil plate.

17. The solder paste preserver of claim 16 wherein the lower section of the shell is a frame configured to encompass a working region on the stencil plate over which the solder paste is moved to print a portion of the solder paste onto a printed circuit board.

18. A solder paste stenciling machine, comprising:

a stencil assembly having a stencil plate with a plurality of holes arranged in a desired pattern to print solder paste on printed circuit boards and a moveable wiper to move a mass of solder paste across the stencil plate and press a portion of the solder paste through the holes and onto a printed circuit board, the stencil plate having a working region defined by the path of the wiper across the stencil plate;

a frame to be positioned on the stencil plate, the frame having a wall configured to surround at least a portion of the solder paste on the stencil plate; and a moveable cover coupled to the frame to form a protective chamber housing the solder paste on the stencil plate between printing cycles.

19. The device of claim 18 wherein the cover is a retractable cover attached to the frame, the retractable cover being in a retracted position at a first end of the frame to allow a wiper to move the solder paste across the stencil plate and the retractable cover being positionable in an extended position from the first end of the frame to a second end of the frame to enclose the solder paste between printing cycles.

20. The device of claim 19 wherein the retractable cover comprises:

a rod attached to the frame at the first end of the frame; and a flexible sheet attached to the rod, the flexible sheet being extensible from the rod to the second end in the extended position, and the flexible sheet being retractable to the rod from the extended position to the retracted position.

21. The device of claim 20 wherein the rod is a roller rotatably attached to the frame, and wherein the flexible sheet is wrapped around the roller in the retracted position and at least a portion of the flexible sheet is unwrapped from the roller in the extended position.

22. The device of claim 20 wherein:

the wall comprises a first section parallel to a first axis of the frame, a second section at least substantially parallel to the first axis and spaced apart from the first section, a third section transverse to the first axis and positioned between the first and second sections, and a fourth section transverse to the first axis and positioned between the first and second sections, the fourth section being spaced apart from the third section; and the rod extends across the frame from the third section to the fourth section at a location near the first section, the rod being rotatably attached to the third and fourth sections.

23. The device of claim 20 wherein the flexible sheet comprises an absorbent material to reduce moisture within the compartment when the retractable cover is in the extended position.

24. The device of claim 20 wherein the flexible sheet comprises a hydrated material to increase moisture within the compartment when the retractable cover is in the extended position.

25. The device of claim 18 wherein the cover comprises a removable cover configured to engage an upper surface of the frame.

26. The device of claim 18 wherein the cover comprises a lid pivotally attached to the frame.

27. The device of claim 18 wherein the cover comprises a ceiling formed integrally with the wall, the device being removable from the stencil plate to allow the wiper to move the solder paste across the stencil plate.

28. A solder paste printing machine, comprising:

a stencil plate with a plurality of holes arranged in a desired pattern to print solder paste on printed circuit boards;

a moveable wiper to move a mass of solder paste across the stencil plate and press a portion of the solder paste through the holes and onto a printed circuit board; and a shell positionable on the stencil plate, the shell having a lower section configured to substantially encompass the solder paste on the stencil plate between printing cycles and an upper section extending over a portion of the stencil plate to substantially enclose the solder paste in a chamber defined by the shell and the stencil plate.

29. The machine of claim 28 wherein the lower section of the shell is a frame configured to encompass a working region on the stencil plate defined by an area over which the solder paste is moved to print a portion of the solder paste onto a printed circuit board.

30. The machine of claim 28 wherein the solder paste is an elongated strip of solder paste extending along a side of the stencil plate, and wherein the lower section of the shell is a frame configured to encompass the elongated strip of solder paste without encompassing a working region on the stencil plate defined by an area over which the elongated strip of solder paste is moved to print a portion of the solder paste onto a printed circuit board.

31. The machine of claim 30 wherein the upper section of the shell is formed integrally with the lower section.

* * * * *